United States Patent
Kim et al.

(10) Patent No.: US 9,203,395 B2
(45) Date of Patent: Dec. 1, 2015

(54) GATE DRIVER AND A DISPLAY DEVICE INCLUDING THE SAME

(71) Applicant: SAMSUNG DISPLAY CO., LTD., Gyeonggi-do (KR)

(72) Inventors: Kang Nam Kim, Chungcheongnam-do (KR); Duc-Han Cho, Seoul (KR); You Mee Hyun, Anyang-si (KR); Jeong-Il Kim, Seoul (KR); Jong Woong Chang, Chungcheongnam-do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 161 days.

(21) Appl. No.: 13/929,937

(22) Filed: Jun. 28, 2013

(65) Prior Publication Data

US 2014/0204009 A1  Jul. 24, 2014

(30) Foreign Application Priority Data

Jan. 23, 2013  (KR) ........................ 10-2013-0007485

(51) Int. Cl.
*G09G 3/36* (2006.01)
*H03K 17/14* (2006.01)

(52) U.S. Cl.
CPC ............ *H03K 17/145* (2013.01); *G09G 3/3677* (2013.01); *G09G 2300/0408* (2013.01); *G09G 2310/0286* (2013.01); *G09G 2320/041* (2013.01)

(58) Field of Classification Search
None
See application file for complete search history.

(56) References Cited

U.S. PATENT DOCUMENTS

| | | | |
|---|---|---|---|
| 7,289,593 B2 | 10/2007 | Tobita et al. | |
| 7,417,458 B2 | 8/2008 | Ahn et al. | |
| 8,174,478 B2 | 5/2012 | Kim et al. | |
| 8,217,885 B2 | 7/2012 | Miyazawa et al. | |
| 2009/0040161 A1* | 2/2009 | Baek et al. | 345/94 |
| 2009/0040203 A1* | 2/2009 | Kim et al. | 345/204 |
| 2009/0086116 A1* | 4/2009 | Pak | 349/38 |
| 2009/0189677 A1 | 7/2009 | Lee et al. | |
| 2009/0189679 A1 | 7/2009 | Lee et al. | |
| 2011/0122117 A1* | 5/2011 | Lee et al. | 345/211 |
| 2011/0157263 A1 | 6/2011 | Kim et al. | |
| 2012/0139883 A1 | 6/2012 | Lee et al. | |
| 2012/0146978 A1 | 6/2012 | Park et al. | |
| 2012/0212275 A1 | 8/2012 | Jang et al. | |

FOREIGN PATENT DOCUMENTS

KR  1020110031748  3/2011

* cited by examiner

*Primary Examiner* — Kathy Wang-Hurst
*Assistant Examiner* — Douglas Wilson
(74) *Attorney, Agent, or Firm* — F. Chau & Associates, LLC

(57) ABSTRACT

A gate driver includes a plurality of stages, wherein an n-th stage includes: a pull-up unit configured to output a high voltage of a clock signal as a high voltage of an n-th gate signal; a pull-down unit configured to decrease the high voltage of the n-th gate signal to a first low voltage; a discharging unit configured to discharge a voltage of the first node to a second low voltage lower than the first low voltage; a carry unit configured to output the high voltage of the clock signal as an n-th carry signal; an inverter unit configured to output a signal in synchronization with the clock signal; a first node storage unit configured to maintain the voltage of the first node at the second low voltage; and a second node storage unit configured to maintain the voltage of the second node at the first or second low voltage.

22 Claims, 8 Drawing Sheets

US 9,203,395 B2

GATE DRIVER AND A DISPLAY DEVICE INCLUDING THE SAME

CROSS-REFERENCE TO RELATED APPLICATION

This application claims priority under 35 U.S.C. §119 to Korean Patent Application No. 10-2013-0007485 filed in the Korean Intellectual Property Office on Jan. 23, 2013, the disclosure of which is incorporated by reference herein in its entirety.

TECHNICAL FIELD

The present invention relates to a gate driver and a display device including the same. More particularly, the present invention relates to a gate driver that stably outputs a gate signal at a high temperature and a display device including the same.

DISCUSSION OF THE RELATED ART

As one of the most widely used display devices, a liquid crystal display (LCD) includes two display panels provided with field generating electrodes such as a pixel electrode and a common electrode, and a liquid crystal layer interposed between the display panels. The LCD displays images by applying voltages to the field generating electrodes to generate an electric field in the liquid crystal layer, wherein the electric field determines the orientation of liquid crystal molecules in the liquid crystal layer to control polarization of incident light. Other example display devices include an organic light emitting device, a plasma display device, and an electrophoretic display.

The display device includes a plurality of pixels for displaying an image, and a plurality of drivers. The drivers include a data driver for applying a data voltage to a pixel, and a gate driver for applying a gate signal to control transmission of the data voltage. The gate driver and the data driver may be chips mounted to a printed circuit board (PCB) and then connected to the display panel, or directly mounted to the display panel. A gate driver has been developed that does not require high mobility of a thin film transistor channel, and thus, this gate driver can be integrated with the display panel, instead of being formed as a chip.

Since the integratable gate driver does not require an additional gate driving chip, manufacturing costs can be reduced. However, when the gate driver is integrated with the display panel the characteristics of a semiconductor (e.g., an amorphous semiconductor) of the thin film transistor may be changed according to temperature. As a result, a gate voltage output at a high temperature may include noise.

SUMMARY

An exemplary embodiment of the present invention provides a gate driver that stably outputs a gate signal at a high temperature and a display device including the same.

A gate driver according to an exemplary embodiment of the present invention includes a plurality of stages connected to each other, wherein an n-th (n is a natural number) stage among the plurality of stages includes: a pull-up unit configured to output a high voltage of a clock signal as a high voltage of an n-th gate signal in response to a signal of a first node; a pull-down unit configured to decrease the high voltage of the n-th gate signal to a first low voltage in response to an (n+1)-th carry signal; a discharging unit configured to discharge a voltage of the first node to a second low voltage lower than the first low voltage in response to a carry signal from at least one stage among stages next to the n-th stage; a carry unit configured to output the high voltage of the clock signal as an n-th carry signal in response to the signal of the first node; an inverter unit configured to output a signal in synchronization with the clock signal to a second node in a period other than a period in which the n-th carry signal is output; a first node storage unit configured to maintain the voltage of the first node at the second low voltage in response to the signal of the second node; and a second node storage unit configured to maintain the voltage of the second node at the first low voltage or the second low voltage in response to the signal of the first node.

A control terminal of the first node storage unit may be connected to the second node, an input terminal of the first node storage unit may be connected to the first node, and an output terminal of the first node storage unit may be connected to a second voltage terminal configured to receive the second low voltage.

A control terminal of the second node storage unit may be connected to the first node, an input terminal of the second node storage unit may be connected to the second node, and an output terminal of the second node storage unit may be connected to the second voltage terminal.

A control terminal of the second node storage unit may be connected to the first node, an input terminal of the second node storage unit may be connected to the second node, and an output terminal of the second node storage unit may be connected to a first voltage terminal configured to receive the first low voltage.

The n-th stage may further include a buffer unit including a control terminal and an input terminal connected to a first input terminal configured to receive an (n−1)-th carry signal, and an output terminal connected to the first node.

The n-th stage may further include a charging unit including a first terminal connected to the first node and a second terminal connected to an output node through which the n-th gate signal may be output.

The n-th stage may further include an output node storage unit configured to maintain the voltage of an output node at the first low voltage in response to the signal of the second node.

The n-th stage may further include a third node storage unit configured to maintain a voltage of a third node through which the carry signal is output in response to the signal of the second node at the second low voltage.

The discharging unit may include a first discharging unit configured to discharge the voltage of the first node to the second low voltage in response to the (n+1)-th carry signal, and a second discharging unit configured to discharge the voltage of the first node to the second low voltage in response to an (n+2)-th carry signal.

The discharging unit may include: a first discharging unit configured to output the voltage of the first node in response to the (n+1)-th carry signal; a second discharging unit configured to discharge the voltage of the first node to the second low voltage in response to an (n+2)-th carry signal; and a third discharging unit configured to discharge the voltage of the first node output from the first discharging unit to the second low voltage.

A display device according to an exemplary embodiment of the present invention includes: a display panel including a display area in which a plurality of gate lines and a plurality of data lines are formed and a peripheral area enclosing the display area; a gate driver integrated with the display panel in the peripheral area and including a plurality of stages configured to output gate signals to the plurality of gate lines; and a data driver configured to output data signals to the plurality of data lines. An n-th (n is a natural number) stage among the plurality of stages includes: a pull-up unit configured to output a high voltage of a clock signal as a high voltage of an n-th gate signal in response to a signal of a first node; a pull-down unit configured to decrease the high voltage of the n-th gate signal to a first low voltage in response to an (n+1)-th carry signal; a discharging unit configured to discharge a voltage of the first node to a second low voltage lower than the first low voltage in response to at least one carry signal from a next stage; a carry unit configured to output the high voltage of the clock signal as an n-th carry signal in response to the signal of the first node; an inverter unit configured to output a signal in synchronization with the clock signal to a second node in a period other than a period in which the n-th carry signal is output; a first node storage unit configured to maintain the voltage of the first node at the second low voltage in response to the signal of the second node; and a second node storage unit configured to maintain the voltage of the second node at the first low voltage or the second low voltage in response to the signal of the first node.

A control terminal of the first node storage unit may be connected to the second node, an input terminal of the first node storage unit may be connected to the first node, and an output terminal of the first node storage unit may be connected to a second voltage terminal configured to receive the second low voltage.

A control terminal of the second node storage unit may be connected to the first node, an input terminal of the second node storage unit may be connected to the second node, and an output terminal of the second node storage unit may be connected to the second voltage terminal.

A control terminal of the second node storage unit may be connected to the first node, an input terminal of the second node storage unit may be connected to the second node, and an output terminal of the second node storage unit may be connected to a first voltage terminal configured to receive the first low voltage.

The n-th stage may further include a buffer unit including a control terminal and an input terminal connected to a first input terminal configured to receive an (n−1)-th carry signal and an output terminal connected to the first node.

The n-th stage may further include a charging unit including a first terminal connected to the first node and a second terminal connected to an output node through which the n-th gate signal may be output.

The n-th stage may further include an output node storage unit configured to maintain a voltage of an output node at the first low voltage in response to the signal of the second node.

The n-th stage may further include a third node storage unit configured to maintain the voltage of a third node through which the carry signal is output in response to the signal of the second node at the second low voltage.

The discharging unit may include a first discharging unit configured to discharge the voltage of the first node to the second low voltage in response to the (n+1)-th carry signal, and a second discharging unit configured to discharge the voltage of the first node to the second low voltage in response to an (n+2)-th carry signal.

The discharging unit may include: a first discharging unit configured to output the voltage of the first node in response to the (n+1)-th carry signal; a second discharging unit configured to discharge the voltage of the first node to the second low voltage in response to an (n+2)-th carry signal; and a third discharging unit configured to discharge the voltage of the first node output from the first discharging unit to the second low voltage.

A gate driver according to an exemplary embodiment of the present invention includes: a first unit configured to output a high voltage of a clock signal as a high voltage of a gate signal in response to a signal at a first node; a second unit configured to decrease the high voltage of the gate signal to a first low voltage in response to a first carry signal; a third unit configured to discharge a voltage of the first node to a second low voltage lower than the first low voltage in response to a second carry signal; a fourth unit including a transistor having a control terminal connected to a second node, an input terminal connected to the first node and a output terminal connected to a voltage terminal; and a fifth unit including a transistor having a control terminal connected to the first node, an input terminal connected to the second node and an output terminal connected to the voltage terminal.

The fifth unit is configured to maintain a voltage of the second node at the second low voltage in response to the signal of the first node while the gate signal is provided to a gate line.

DETAILED DESCRIPTION OF THE EMBODIMENTS

Figure 1:
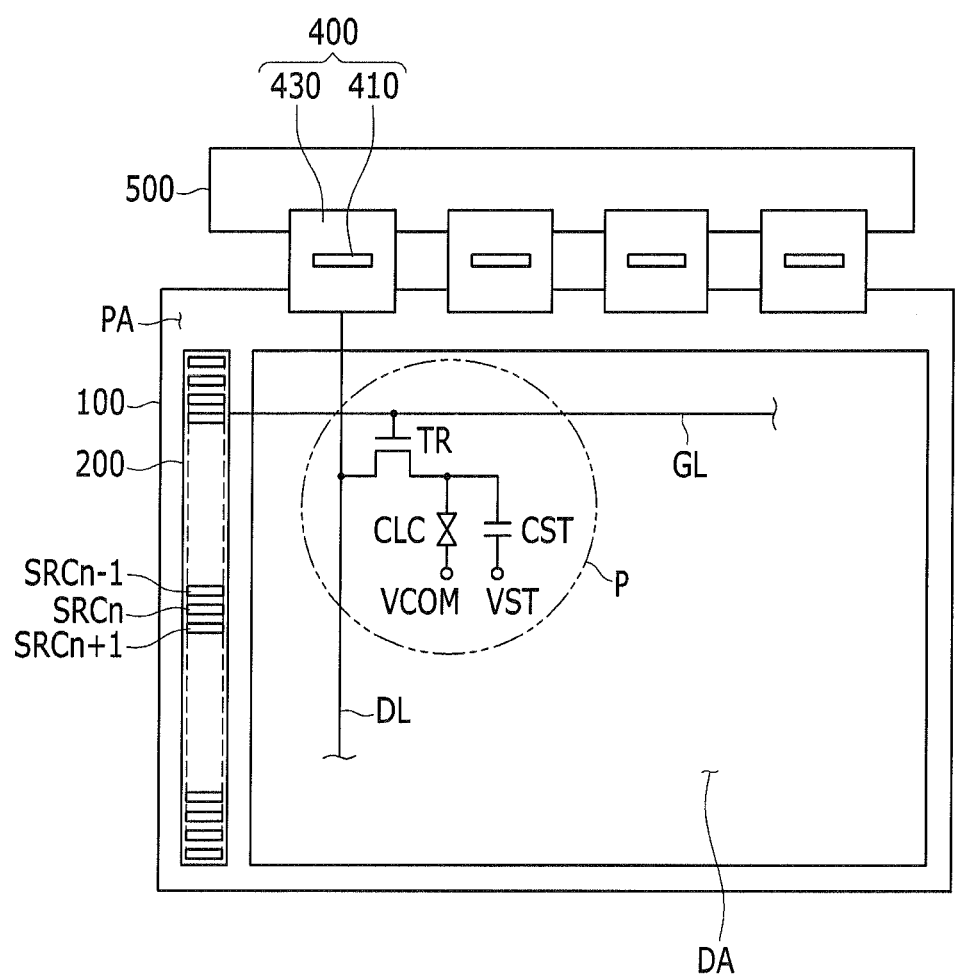
FIG. 1 is a top plan view of a display device according to an exemplary embodiment of the present invention.

Exemplary embodiments of the present invention will be described more fully hereinafter with reference to the accompanying drawings. However, the present invention may be modified in various different ways and should not be construed as limited to the embodiments disclosed herein.

In the drawings, the thickness of layers, films, panels, regions, etc., may be exaggerated for clarity. Like reference numerals may designate like elements throughout the specification. It will be understood that when an element such as a layer, film region, or substrate is referred to as being "on" another element, it can be directly on the other element or intervening elements may also be present.

First, a display device according to an exemplary embodiment of the present invention will be described with reference to FIG. 1.

FIG. 1 is a top plan view of a display device according to an exemplary embodiment of the present invention.

Referring to FIG. 1, the display device includes a display panel 100, a gate driver 200, a data driver 400, and a printed circuit board (PCB) 500.

The display panel 100 includes a display area DA and a peripheral area PA enclosing the display area DA. In the display area DA, a gate line GL and a data line DL crossing each other and a plurality of pixels P are positioned. Each pixel P includes a switching element TR electrically connected to the gate line GL and the data line DL, a liquid crystal capacitor CLC electrically connected to the switching element TR, and a storage capacitor CST connected in parallel to the liquid crystal capacitor CLC. The liquid crystal capacitor CST may be connected to a common voltage VCOM and the storage capacitor CST may be connected to a storage voltage VST.

The gate driver 200 includes a shift register for sequentially outputting gate signals of a high level to a plurality of gate lines GL. The shift register includes a plurality of stages SRCn−1, SRCn, and SRC(n+1) (n is a natural number). The gate driver 200 may be integrated in the peripheral area PA corresponding to one terminal of the gate line GL. In the present exemplary embodiment, the gate driver 200 is integrated to correspond to the one terminal of the gate line GL; however, the gate driver 200 may be integrated to correspond to both ends of the gate line GL. For example, the gate driver 200 may be integrated with the display panel 100 at one end of the gate lines or both ends of the gate lines.

The data driver 400 includes a source driving chip 410 for outputting data signals to the data line DL and a flexible circuit board 430 on which the source driving chip 410 is mounted. The flexible circuit board 430 may electrically connect the printed circuit board (PCB) 500 and the display panel 100. In the present exemplary embodiment, the source driving chip 410 is mounted on the flexible circuit board 430; however, the source driving chip 410 may be directly integrated with the display panel 100, or more specifically, the source driving chip 410 may be directly integrated with the display panel 100 in the peripheral area PA of the display panel 100.

Although the display device described above is a liquid crystal display, other types of displays may be used in accordance with the present invention. For example, the display device may be an organic light emitting device, a plasma display device, or an electrophoretic display.

Next, a gate driver of a display device according to an exemplary embodiment of the present invention will be described with reference to FIG. 2.

Figure 2:
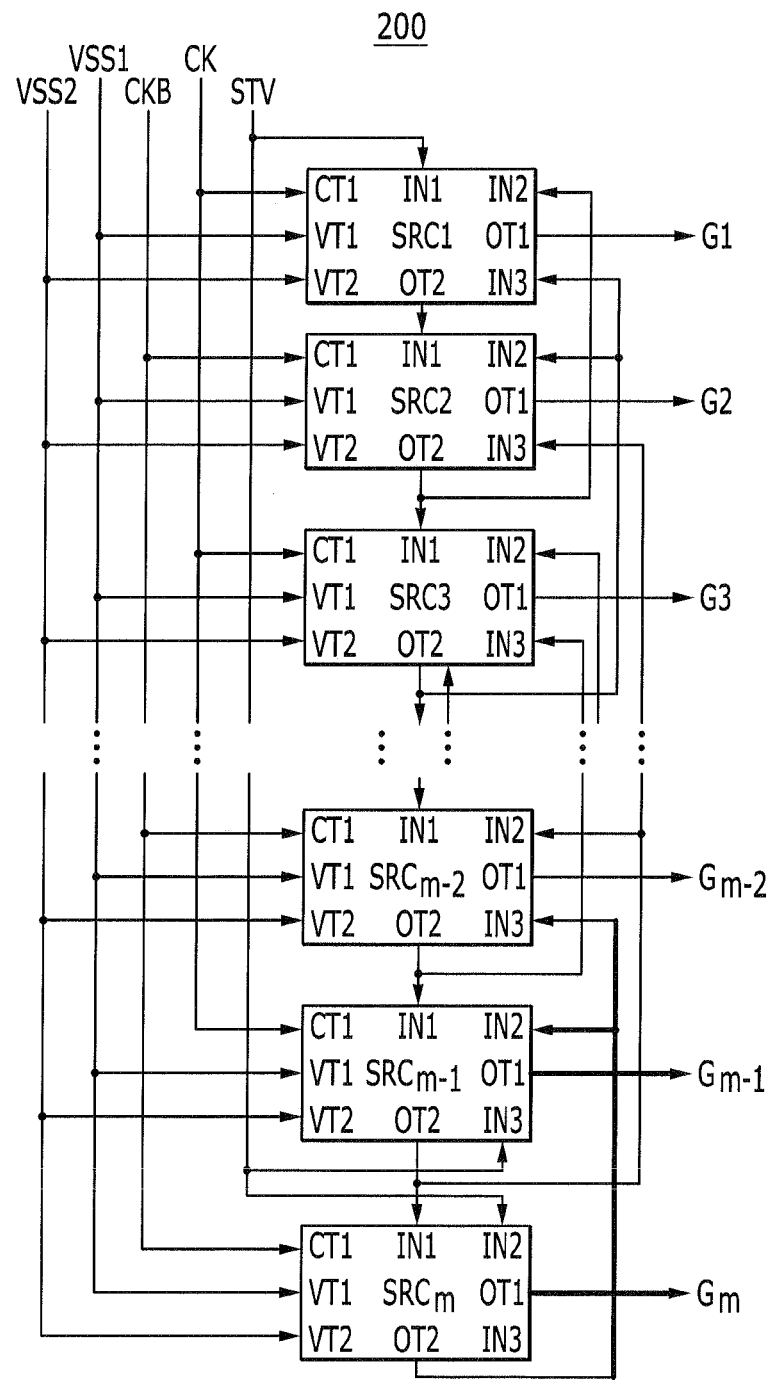
FIG. 2 is a block diagram of a gate driver of a display device according to an exemplary embodiment of the present invention.

FIG. 2 is a block diagram of a gate driver of a display device according to an exemplary embodiment of the present invention.

The gate driver 200 of the display device according to an exemplary embodiment of the present invention includes a shift register including first to m-th stages SRC1 to SRCm subordinately connected to each other.

The first to m-th stages SRC1 to SRCm are respectively connected to m gate lines and sequentially output m gate signals to the m gate lines.

Each stage includes a first clock terminal CT1, a first input terminal IN1, a second input terminal IN2, a third input terminal IN3, a first voltage terminal VT1, a second voltage terminal VT2, a first output terminal OT1, and a second output terminal OT2.

The first clock terminal CT1 receives a clock signal CK or an inversion clock signal CKB having an inverted phase of the clock signal CK. For example, the first clock terminal CT1 of odd-numbered stages SRC1, SRC3, . . . receives the clock signal CK and the first clock terminal CT1 of even-numbered stages SRC2, SRC4, . . . receives the inversion clock signal CKB. The clock signal CK and the inversion clock signal CKB may include a high voltage VDD and a first low voltage VSS1.

The first input terminal IN1 receives a vertical start signal STV or an (n−1)-th carry signal Cr(n−1). For example, the first input terminal IN1 of the first stage SRC1 receives a vertical start signal STV, and the first input terminal IN1 of the second stage SRC2 to the m-th stage SRCm respectively receive the (n−1)-th carry signal Cr(n−1).

The second input terminal IN2 receives the (n+1)-th carry signal Cr(n+1) or the vertical start signal STV. For example, the second input terminal IN2 of the first stage SRC1 to the (m−1)-th stage SRC(m−1) receives the (n+1)-th carry signal Cr(n+1), and the second input terminal IN2 of the m-th stage SRCm receives the vertical start signal STV. The vertical start signal STV input to the second input terminal IN2 of the m-th stage SRCm may be the vertical start signal corresponding to a next frame.

The third input terminal IN3 receives the (n+2)-th carry signal Cr(n+2) or the vertical start signal STV. For example, the third input terminal IN3 of the first stage SRC1 to the (m−2)-th stage SRC(m−2) receives the (n+2)-th carry signal Cr(n+2), and the third input terminal IN3 of the (m−1)-th stage SRC(m−1) receives the vertical start signal STV.

The first voltage terminal VT1 receives the first low voltage VSS1. The first low voltage VSS1 has a first low level and the first low level corresponds to a discharging level of the gate signal. For example, the first low level may be about −6 V.

The second voltage terminal VT2 receives a second low voltage VSS2 having a second low level that is lower the first low level. The second low level corresponds to the discharging level of a first node (Q) included in the stage. For example, the second low level may be about −10 V.

The first output terminal OT1 is electrically connected to its corresponding gate line to output the gate signal. The first output terminal OT1 of the first stage to the m stages SRC1 to SRCm respectively outputs first to m-th gate signals. For example, the first output terminal OT1 of the first stage SRC1 is electrically connected to the first gate line to output first gate signal G1, and the first output terminal OT1 of the second stage SRC2 is electrically connected to the second gate line to output a second gate signal G2. After the first gate signal G1 is first output, the second gate signal G2 is output. Next, a third gate signal G3 to an m-th gate signal Gm are sequentially output.

The second output terminal OT2 outputs the carry signal Cr(n). The second output terminal OT2 of the n-th stage SRCn is electrically connected to the first input terminal IN1 of the (n+1)-th stage SRC(n+1). In addition, the second output terminal OT2 of the n-th stage SRn is electrically connected to the second input terminal IN2 of the (n−1)-th stage SRC(n−1) and the third input terminal IN3 of the (n−2)-th stage SRC(n−2).

Next, one stage of a gate driver of a display device according to an exemplary embodiment of the present invention will be described with reference to FIG. 3.

Figure 3:
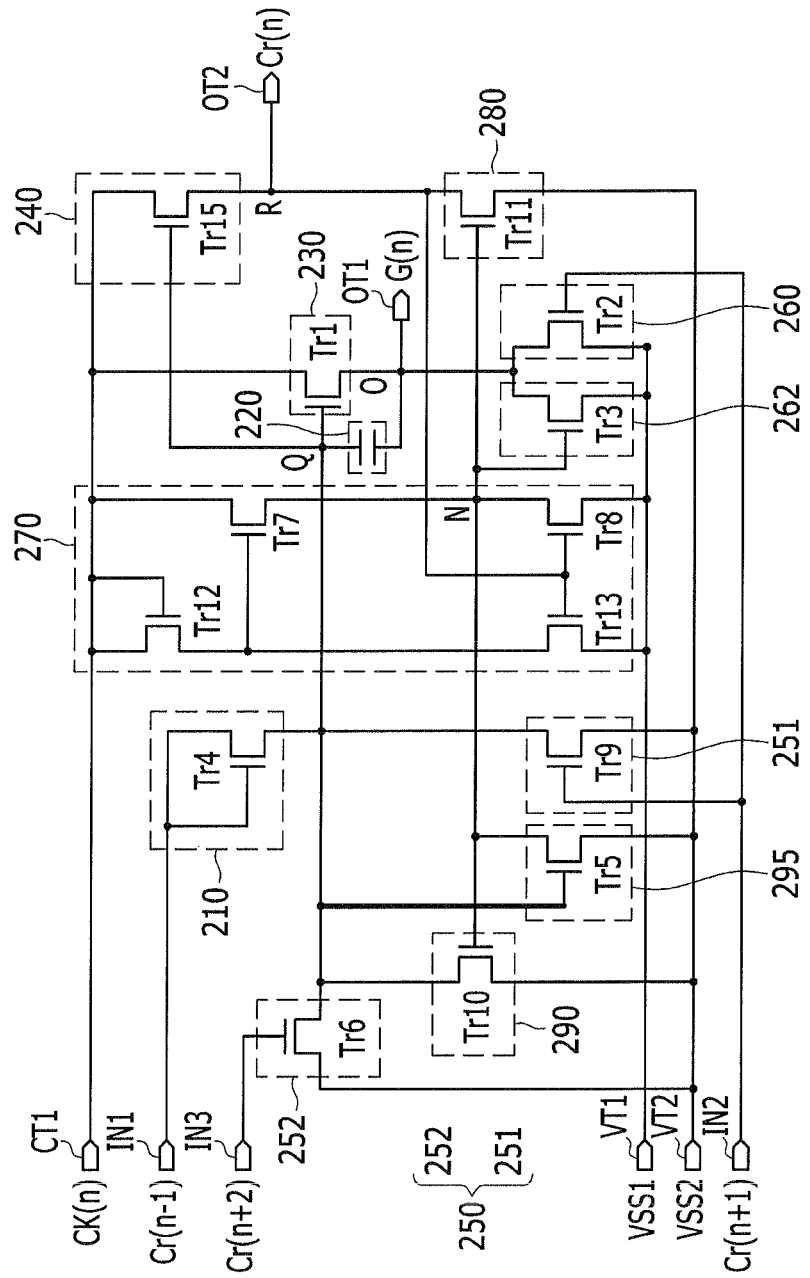
FIG. 3 is a circuit diagram of one stage of a gate driver of a display device according to an exemplary embodiment of the present invention.

FIG. 3 is a circuit diagram of one stage of a gate driver of a display device according to an exemplary embodiment of the present invention.

The n-th stage SRCn of the gate driver of the display device according to an exemplary embodiment of the present invention includes a buffer unit 210, a charging unit 220, a pull-up unit 230, a pull-down unit 260, an output node storage unit 262, a carry unit 240, a third node storage unit 280, an inverter unit 270, a discharging unit 250, a first node storage unit 290, and a second node storage unit 295.

The buffer unit 210 transmits the (n−1)-th carry signal Cr(n−1) to the pull-up unit 230. The buffer unit 210 may include a fourth transistor Tr4. The fourth transistor Tr4 includes a control terminal and an input terminal connected to the first input terminal IN1, and an output terminal connected to the first node (Q).

The charging unit 220 is charged in response to the (n−1)-th carry signal Cr(n−1) provided by the buffer unit 210. One terminal of the charging unit 220 is connected to the first node (Q), and the other terminal is connected to an output node (O) through which the n-th gate signal G(n) is output. If the buffer unit 210 is input with the high voltage VDD of the (n−1)-th carry signal Cr(n−1), the charging unit 220 charges a first voltage V1 corresponding to the high voltage VDD.

The pull-up unit 230 outputs the n-th gate signal G(n). The pull-up unit 230 may include a first transistor Tr1. The first transistor Tr1 includes a control terminal connected to the first node (Q), an input terminal connected to the first clock terminal CT1, and an output terminal connected to the output node (O). The output node (O) is connected to the first output terminal OT1.

In the case that the first voltage V1 is charged by the charging unit 220 and the first voltage V1 is provided to the control terminal of the pull-up unit 230, if the high voltage VDD of the clock signal CK is input to the first clock terminal CT1, the pull-up unit 230 is bootstrapped. At this time, the first node (Q) connected to the control terminal of the pull-up unit 230 is boosted from the first voltage V1 to a boosting voltage VBT. In other words, the first node (Q) is first increased to the first voltage V1, and then, again increased to the boosting voltage VBT.

While the control terminal of the pull-up unit 230 is applied with the boosting voltage VBT, the pull-up unit 230 outputs the high voltage VDD of the clock signal CK as the high voltage VDD of the n-th gate signal G(n). The n-th gate signal G(n) is output through the first output terminal OT1 connected to the output node (O).

The pull-down unit 260 pulls down the n-th gate signal G(n). The pull-down unit 260 may include a second transistor Tr2. The second transistor Tr2 includes a control terminal connected to the second input terminal IN2, an input terminal connected to the output node (O), and an output terminal connected to the first voltage terminal VT1. If the second input terminal IN2 is input with the (n+1)-th carry signal Cr(n+1), the pull-down unit 260 pulls down the voltage of the output node (O) to the first low voltage VSS1 applied to the first voltage terminal VT1.

The output node storage unit 262 maintains the voltage of the output node (O). The output node storage unit 262 may include a third transistor Tr3. The third transistor Tr3 includes a control electrode connected to a second node (N), an input electrode connected to the output node (O), and an output electrode connected to the first voltage terminal VT1. The output node storage unit 262 maintains the voltage of the output node (O) as the first low voltage VSS1 applied to the first voltage terminal VT1 in response to the signal of the second node (N).

The voltage of the output node (O) that is pulled down to the first low voltage VSS1 by the output node storage unit 262 may be further maintained to be stable by the output node storage unit 262, and in some cases, the output node storage unit 262 may be omitted.

The carry unit 240 outputs the carry signal Cr(n). The carry unit 240 may include a fifteenth transistor Tr15. The fifteenth transistor Tr15 includes a control terminal connected to the first node (Q), an input terminal connected to the first clock terminal CT1, and an output terminal connected to a third node (R). The third node (R) is connected to the second output terminal OT2.

The carry unit 240 may further include a capacitor connected between the control terminal and the output terminal of the fifteenth transistor Tr15. If the first node (Q) is input with the high voltage VDD, the carry unit 240 outputs the high voltage VDD of the clock signal CK input via the first clock terminal CT1 as the n-th carry signal Cr(n). The n-th carry signal Cr(n) is output through the second output terminal OT2 connected to the third node (R).

The third node storage unit 280 maintains the voltage of the third node (R). The third node storage unit 280 may include an eleventh transistor Tr11. The eleventh transistor Tr11 includes a control terminal connected to the second node (N), an input terminal connected to the third node (R), and an output terminal connected to the second voltage terminal VT2. The third node storage unit 280 maintains the voltage of the third node (R) as the second low voltage VSS2 in response to the signal of the second node (N).

The inverter unit 270 applies a signal having the same phase as the clock signal CK input to the first clock terminal CT1 to the second node (N) during a period other than the output period of the n-th carry signal Cr(n). The inverter unit 270 may include a twelfth transistor Tr12, a seventh transistor Tr7, a thirteenth transistor Tr13, and an eighth transistor Tr8.

The twelfth transistor Tr12 includes a control terminal and an input terminal connected to the first clock terminal CT1 and an output terminal connected to an input terminal of the thirteenth transistor Tr13 and a control terminal of the seventh transistor Tr7. The seventh transistor Tr7 includes the control terminal connected to the thirteenth transistor Tr13, an input terminal connected to the first clock terminal CT1, and an output terminal connected to an input terminal of the eighth transistor Tr8. The output terminal of the seventh transistor Tr7 is connected to the second node (N).

The thirteenth transistor Tr13 includes a control terminal connected to the third node (R), the input terminal connected to the twelfth transistor Tr12, and an output terminal connected to the first voltage terminal VT1. The eighth transistor Tr8 includes a control terminal connected to the third node (R), the input terminal connected to the second node (N), and an output terminal connected to the first voltage terminal VT1.

While the third node (R) is applied with the high voltage VDD, the inverter unit 270 discharges the clock signal CK input to the first clock terminal CT1 to the first low voltage VSS1 applied to the first voltage terminal VT1. In other words, in response to the high voltage of the third node (R), the eighth and thirteenth transistors Tr8 are Tr13 are turned on such that the clock signal CK is discharged to the first low voltage VSS1. Accordingly, the second node (N) as the output node of the inverter unit 270 is maintained as the first low voltage VSS1 while the n-th gate signal G(n) is output.

The discharging unit 250 discharges the high voltage VDD of the first node (Q) to the second low voltage VSS2 having the lower level than the first low voltage VSS1 in response to at least one carry signal of a next stage. In the present exemplary embodiment, the discharging unit 250 discharges the high voltage VDD of the first node (Q) in response to the (n+1)-th carry signal Cr(n+1) and the (n+2)-th carry signal Cr(n+2).

The discharging unit 250 may include a first discharging unit 251 and a second discharging unit 252.

The first discharging unit 251 may include a ninth transistor Tr9. The ninth transistor Tr9 includes a control terminal connected to the second input terminal IN2, an input terminal connected to the first node (Q), and an output terminal connected to the second voltage terminal VT2. If the second input terminal IN2 is applied with the (n+1)-th carry signal Cr(n+1), the first discharging unit 251 discharges the voltage of the first node (Q) to the second low voltage VSS2 applied to the second voltage terminal VT2.

The second discharging unit 252 may include a sixth transistor Tr6. The sixth transistor Tr6 includes a control terminal connected to the third input terminal IN3, an input terminal connected to the first node (Q), and an output terminal connected to the second voltage terminal VT2. If the third input terminal IN3 is applied with the (n+2)-th carry signal Cr(n+2), the second discharging unit 252 discharges the voltage of the first node (Q) to the second low voltage VSS2 applied to the second voltage terminal VT2.

Accordingly, the voltage of the first node (Q) is increased to the boosting voltage (VBT) from the first voltage V1, and then, decreased to the second low voltage VSS2.

In the above description, the output terminal of the ninth transistor Tr9 is connected to the second voltage terminal VT2; however, the present invention is not limited thereto, and the output terminal of the ninth transistor Tr9 may be connected to the first voltage terminal VT1.

The first node storage unit 290 maintains the voltage of the first node (Q). The first node storage unit 290 may include a tenth transistor Tr10. The tenth transistor Tr10 includes a control terminal connected to the second node (N), an input terminal connected to the first node (Q), and an output terminal connected to the second voltage terminal VT2. The first node storage unit 290 maintains the voltage of the first node (Q) as the second low voltage VSS2 in response to the signal of the second node (N).

The second node storage unit 295 maintains the voltage of the second node (N). The second node storage unit 295 may include a fifth transistor Tr5. The fifth transistor Tr5 includes a control terminal connected to the first node (Q), an input terminal connected to the second node (N), and an output terminal connected to the second voltage terminal VT2. The second node storage unit 295 maintains the voltage of the second node (N) as the second low voltage VSS2 in response to the signal of the first node (Q).

At an initial period in which the n-th gate signal G(n) is output, the seventh transistor Tr7 and the eighth transistor Tr8 are simultaneously turned on, and the clock signal CK is increased faster than the carry signal Cr(n) such that a glitch may be generated in the voltage of the second node (N) at the output terminal of the inverter unit 270.

In addition, during the period in which the n-th gate signal G(n) is output, it may be ideal for the voltage of the second node (N) to be maintained as the first low voltage VSS1; however, the voltage of the second node (N) may be substantially higher than the first low voltage VSS1. Accordingly, a leakage current may be generated to the tenth transistor Tr10 having the control terminal connected to the second node (N) such that the voltage of the first node (Q) may be decreased.

However, the gate driver of the display device according to an exemplary embodiment of the present invention includes the second node storage unit 295 having the control terminal connected to the first node (Q) such that the decrease of the voltage of the first node (Q) may be prevented.

The input terminal of the fifth transistor Tr5 forming the second node storage unit 295 is connected to the second node (N), and the output terminal of the fifth transistor Tr5 is connected to the second voltage terminal VT2 such that the voltage of the second node (N) may be maintained as the second low voltage VSS2 while the n-th gate signal G(n) is applied. Accordingly, the leakage current of the tenth transistor Tr10 having the control terminal connected to the second node (N) may be prevented and the voltage drop of the first node (Q) may be prevented.

Next, a gate driver of a display device according to an exemplary embodiment of the present invention will be described with reference to FIG. 4.

Figure 4:
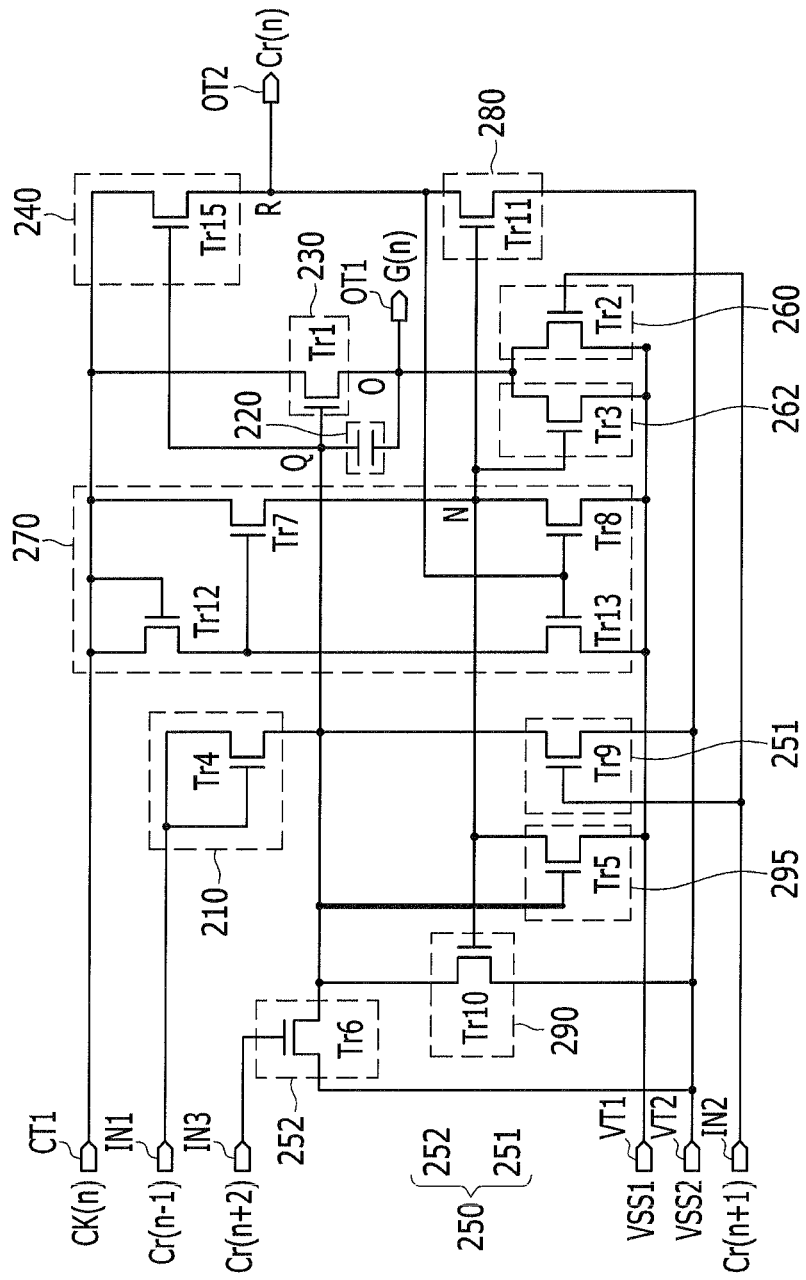
FIG. 4 to FIG. 6 are circuit diagrams of one stage of a gate driver of a display device according to exemplary embodiments of the present invention.

The gate driver of the display device according to an exemplary embodiment of the present invention shown in FIG. 4 is about the same as most of the exemplary embodiment shown in FIG. 1 to FIG. 3 such that most of the overlapping description is omitted and a difference between the embodiments will be described. The difference from the previous exemplary embodiment is a connection position of the output terminal of the fifth transistor Tr5, and this will now be described in detail.

FIG. 4 is a circuit diagram of one stage of the gate driver of the display device according to an exemplary embodiment of the present invention.

The n-th stage SRCn of the gate driver of the display device according to an exemplary embodiment of the present invention includes a buffer unit 210, a charging unit 220, a pull-up unit 230, a pull-down unit 260, an output node storage unit 262, a carry unit 240, a third node storage unit 280, an inverter unit 270, a discharging unit 250, a first node storage unit 290, and a second node storage unit 295.

The second node storage unit 295 maintains the voltage of the second node (N). The second node storage unit 295 may include the fifth transistor Tr5. The fifth transistor Tr5 includes a control terminal connected to the first node (Q), an input terminal connected to the second node (N), and an output terminal connected to the first voltage terminal VT1. The second node storage unit 295 maintains the voltage of the second node (N) as the first low voltage VSS1 in response to the signal of the first node (Q).

The input terminal of the fifth transistor Tr5 forming the second node storage unit 295 is connected to the second node (N) and the output terminal of the fifth transistor Tr5 is connected to the first voltage terminal VT1 such that the voltage of the second node (N) may be maintained as the first low voltage VSS1 while the n-th gate signal G(n) is applied. Accordingly, the leakage current of the tenth transistor Tr10 having the control terminal connected to the second node (N) may be prevented, and the voltage drop of the first node (Q) may be prevented.

Next, a gate driver of a display device according to an exemplary embodiment of the present invention will be described with reference to FIG. 5.

Figure 5:
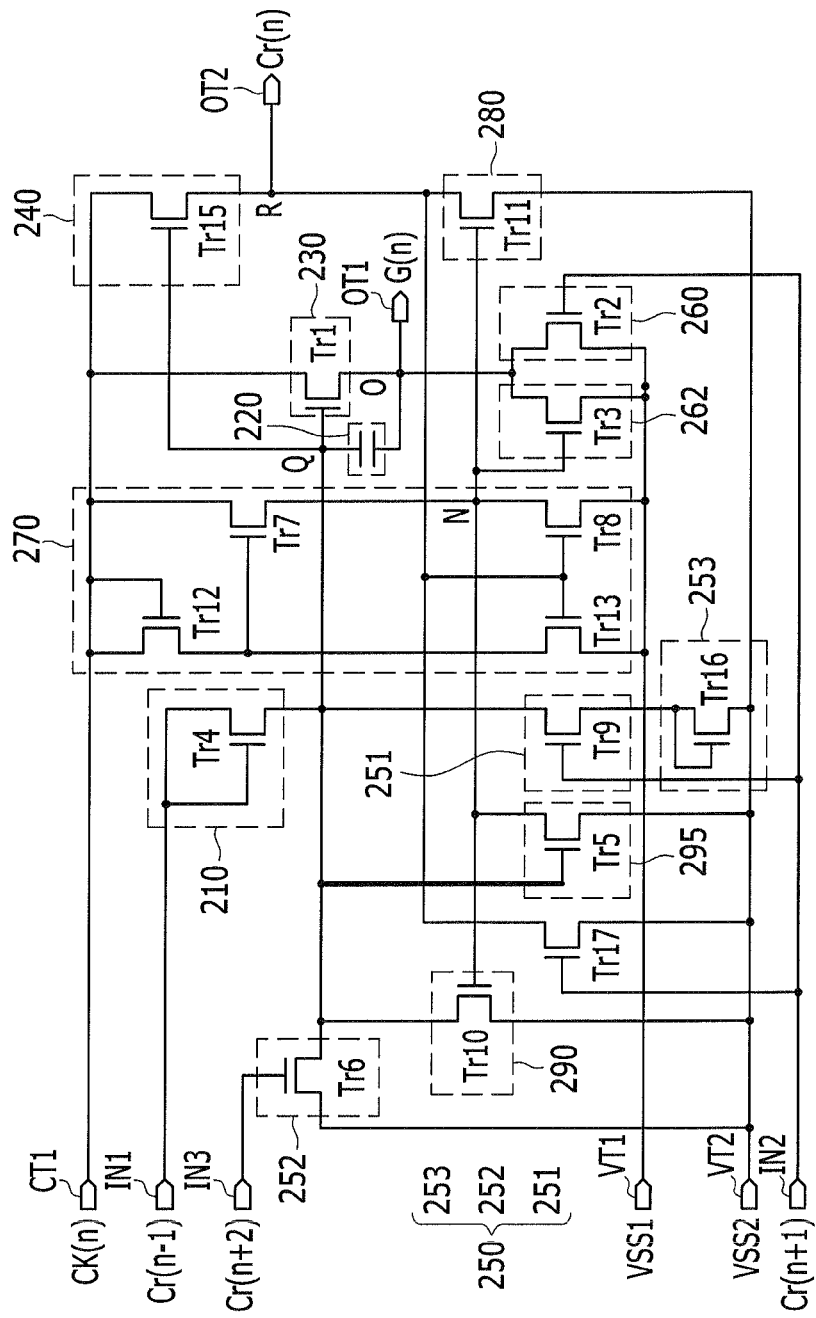

The gate driver of the display device according to an exemplary embodiment of the present invention shown in FIG. 5 is about the same as most of the exemplary embodiment shown in FIG. 1 to FIG. 3 such that most of the overlapping description is omitted and a difference between the embodiments will be described. The difference from the previous exemplary embodiment is the addition of a sixteenth transistor Tr16 and a seventeenth Tr17 transistor, and this will now be described in detail.

FIG. 5 is a circuit diagram of one stage of the gate driver of the display device according to an exemplary embodiment of the present invention.

An n-th stage SRCn of the gate driver of the display device according to an exemplary embodiment of the present invention includes a buffer unit 210, a charging unit 220, a pull-up unit 230, a pull-down unit 260, an output node storage unit 262, a carry unit 240, a third node storage unit 280, an inverter unit 270, a discharging unit 250, a first node storage unit 290, and a second node storage unit 295.

The discharging unit 250 may include a first discharging unit 251, a second discharging unit 252, and a third discharging unit 253.

The first discharging unit 251 may include the ninth transistor Tr9. The ninth transistor Tr9 includes a control terminal connected to the second input terminal IN2, an input terminal connected to the first node (Q), and an output terminal connected to third discharging unit 253. If the second input terminal IN2 is applied with the (n+1)-th carry signal Cr(n+1), the first discharging unit 251 outputs the voltage of the first node (Q) to the third discharging unit 253.

The third discharging unit 253 may include the sixteenth transistor Tr16. The sixteenth transistor Tr16 includes a control terminal and an input terminal connected to the output terminal of the first discharging unit 251 and an output terminal connected to the second voltage terminal VT2. The third discharging unit 253 discharges the voltage of the first node (Q) applied from the first discharging unit 251 to the second low voltage VSS2.

The second discharging unit 252 may include the sixth transistor Tr6. The sixth transistor Tr6 includes a control terminal connected to the third input terminal IN3, an input terminal connected to the first node (Q), and an output terminal connected to the second voltage terminal VT2. If the third input terminal IN3 is applied with the (n+2)-th carry signal Cr(n+2), the second discharging unit 252 discharges the voltage of the first node (Q) to the second low voltage VSS2 applied to the second voltage terminal VT2.

Furthermore, the gate driver of the display device according to an exemplary embodiment of the present invention may further include the seventeenth transistor Tr17. The seventeenth transistor Tr17 includes a control terminal connected to the second input terminal IN2, an input terminal connected to the third node (R), and an output terminal connected to the second voltage terminal VT2. If the second input terminal IN2 is applied with the (n+1)-th carry signal Cr(n+1), the seventeenth transistor Tr17 discharges the voltage of the third node (R) to the second low voltage VSS2.

Next, a gate driver of a display device according to an exemplary embodiment of the present invention will be described with reference to FIG. 6.

Figure 6:
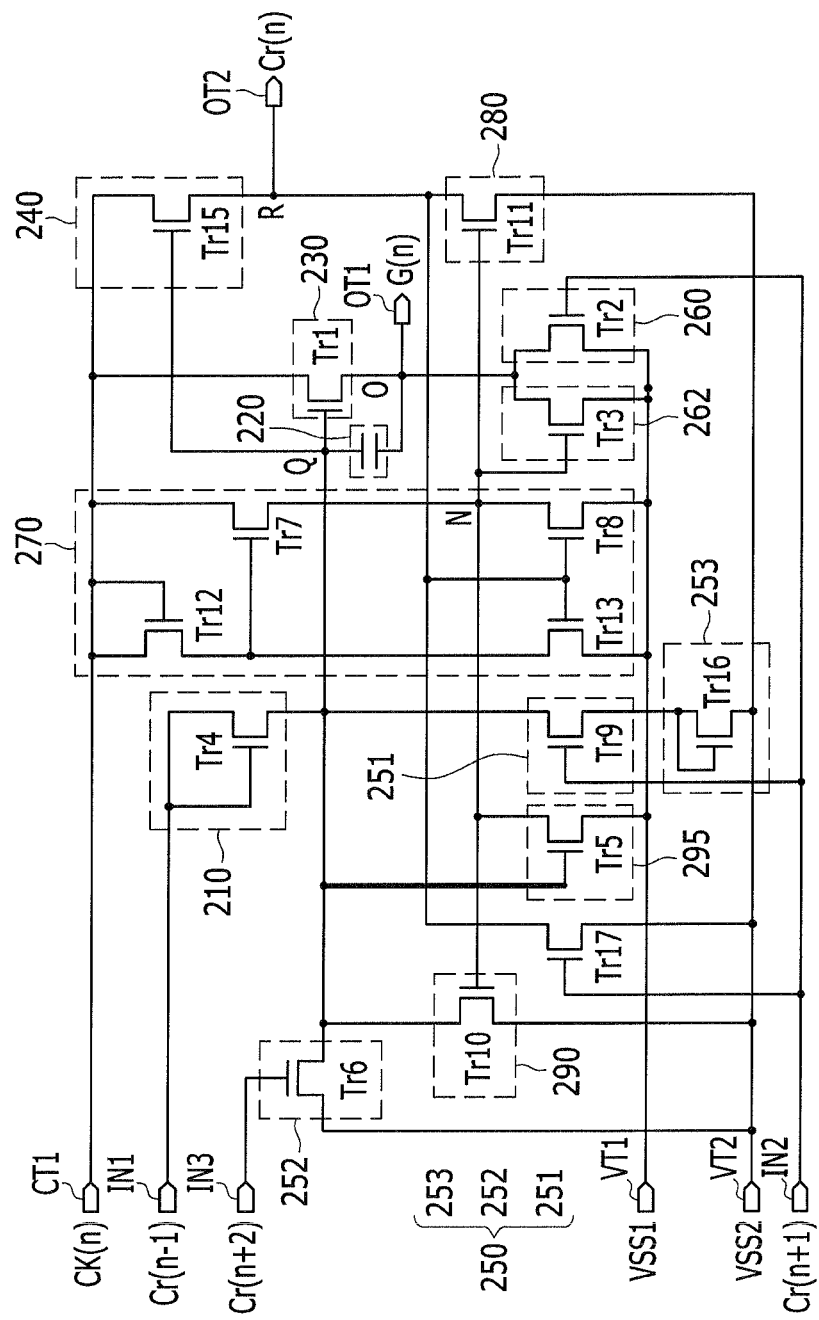

The gate driver of the display device according to an exemplary embodiment of the present invention shown in FIG. 6 is about the same as most of the exemplary embodiment shown in FIG. 5 such that most of the overlapping description is omitted and a difference between the embodiments will be described. The difference from the previous exemplary embodiment is a connection position of the output terminal of the fifth transistor Tr5, and this will now be described in detail.

FIG. 6 is a circuit diagram of one stage of the gate driver of the display device according to an exemplary embodiment of the present invention.

The n-th stage SRCn of the gate driver of the display device according to an exemplary embodiment of the present invention includes a buffer unit 210, a charging unit 220, a pull-up unit 230, a pull-down unit 260, an output node storage unit 262, a carry unit 240, a third node storage unit 280, an inverter unit 270, a discharging unit 250, a first node storage unit 290, and a second node storage unit 295.

The discharging unit 250 may include a first discharging unit 251, a second discharging unit 252, and a third discharging unit 253.

A control terminal of the fifth transistor Tr5 forming the second node storage unit 295 is connected to the first node (Q), an input terminal of the fifth transistor Tr5 is connected to the second node (N), and an output terminal of the fifth transistor Tr5 is connected to the first voltage terminal VT1.

Next, waveforms illustrating a degree of gate signal delay at points in the gate driver of the display device according to an exemplary embodiment of the present invention will be described with reference to FIG. 7 and FIG. 8.

Figure 7:
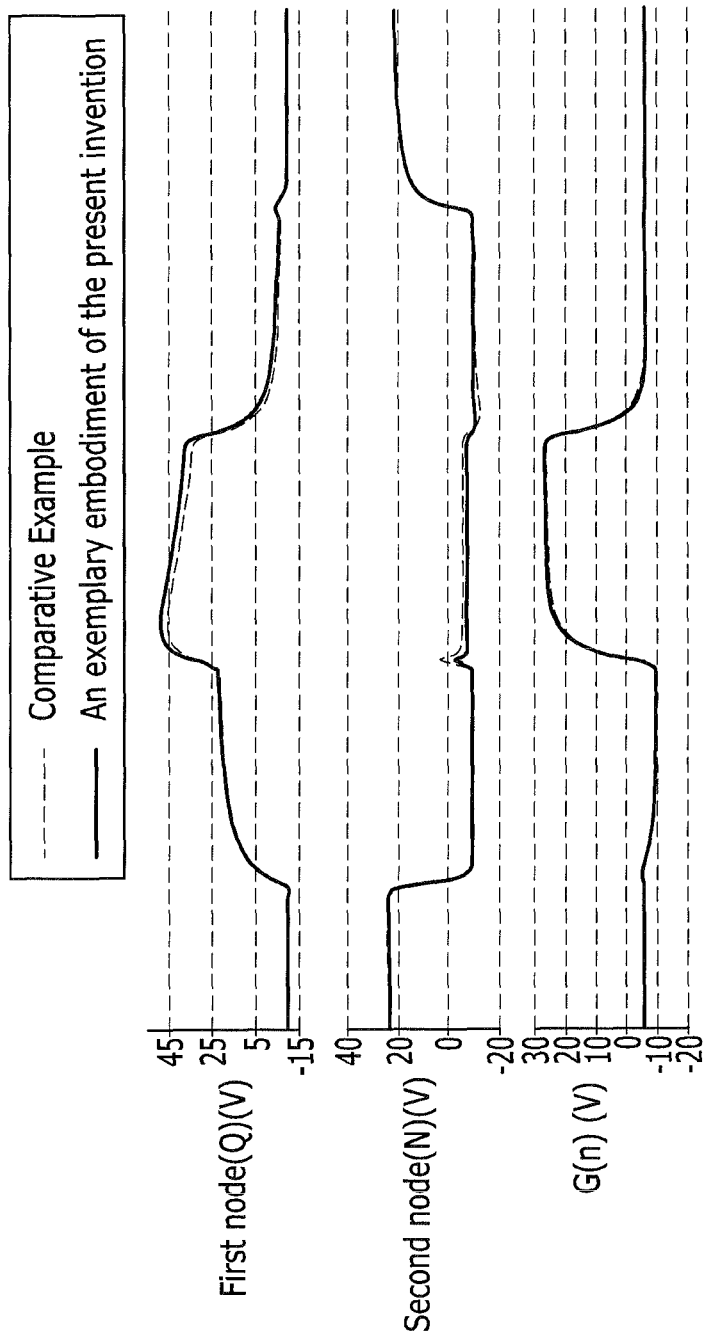
FIG. 7 is a graph showing a voltage at a pair of points in a gate driver of a display device according to an exemplary embodiment of the present invention along with a comparative example.
Figure 8:
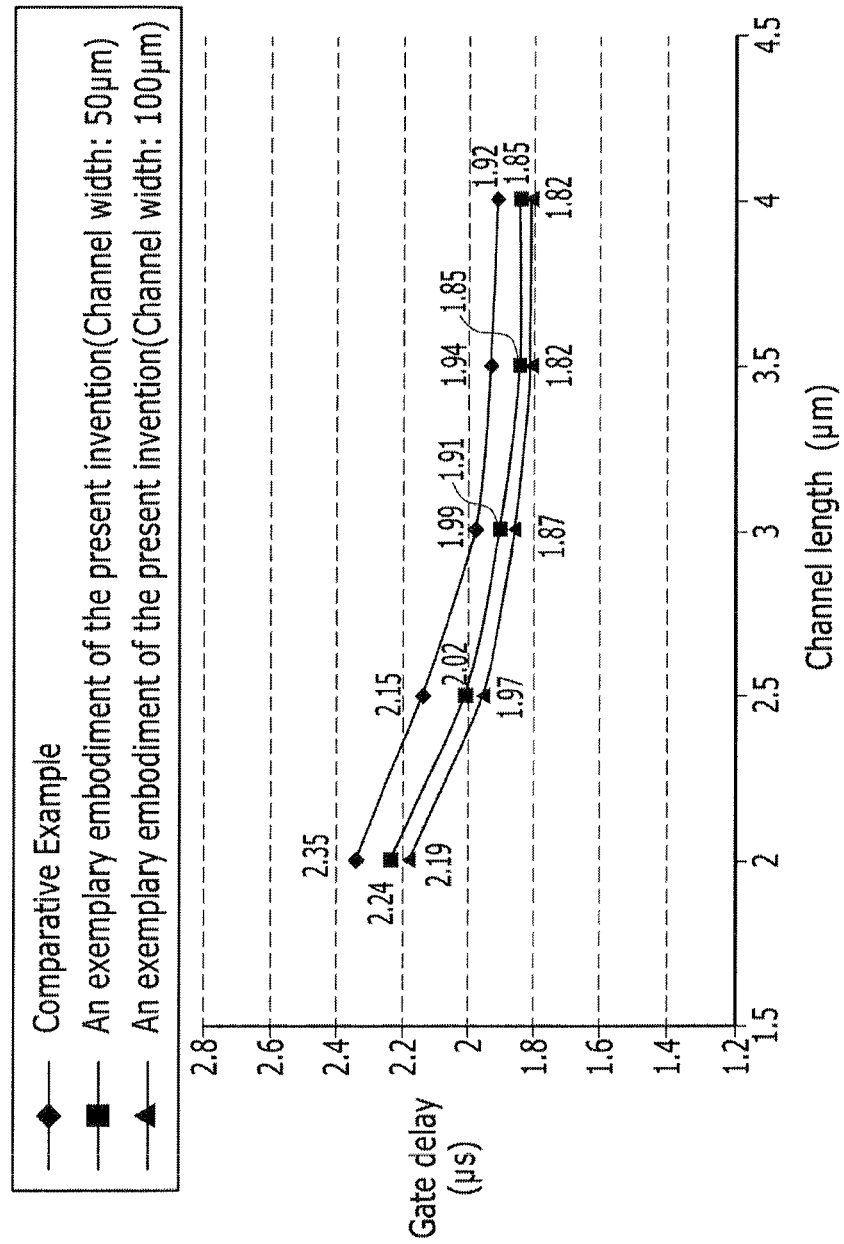
FIG. 8 is a graph showing a gate signal delay of a gate driver of a display device according to an exemplary embodiment of the present invention along with a comparative example.

FIG. 7 is a graph showing a voltage at a pair of points in a gate driver of a display device according to an exemplary embodiment of the present invention along with a comparative example, and FIG. 8 is a graph showing a gate signal delay of a gate driver of a display device according to an exemplary embodiment of the present invention along with a comparative example.

The comparative example is a case that the control terminal of the fifth transistor Tr5 is connected to the first input terminal IN1.

First, in FIG. 7, referring to the voltage of the first node (Q), in an exemplary embodiment of the present invention compared with the comparative example, the voltage of the first node (Q) is increased by about 2.5 V while the high level of the gate signal G(n) is output. The high level of the gate signal G(n) may be above 20 V. In other words, since the control terminal of the fifth transistor Tr5 is connected to the second node (N) in an exemplary embodiment of the present invention instead of to the first input terminal IN1 in the comparative example, the voltage drop of the first node (Q) may be prevented.

In addition, referring to the voltage of the second node (N), in an exemplary embodiment of the present invention compared with the comparative example, a glitch is decreased by 5 V or more in the initial period while the high level of the gate signal G(n) is output, and the voltage of the second node (N) is decreased by 2 V or more while the high level of the gate signal G(n) is output.

In addition, the timing at which the high level of the gate signal G(n) is output is faster and the timing at which the high level is decreased to the low level is faster such that the delay of the gate signal G(n) may be prevented.

Referring to FIG. 8, in an exemplary embodiment of the present invention compared with the comparative example, it can be seen that the delay of the gate signal may be reduced. In addition, in an exemplary embodiment of the present invention, it can be seen that the delay degree of the gate signal is changed according to a channel width and a channel length of the fifth transistor Tr5. By referring to such data, the channel width and the channel length of the fifth transistor Tr5 may be appropriately selected.

In accordance with an exemplary embodiment of the present invention, the gate driver includes the second node storage unit for maintaining the voltage of the second node as the second low voltage in response to the high voltage of the first node, thereby preventing the leakage current in the first node storage unit while the gate signal is output. Accordingly, the decrease of the voltage of the first node may be prevented while the gate signal is output, thereby the gate signal may be stably output even at high temperatures.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A gate driver, comprising
a plurality of stages connected to each other,
wherein an n-th (n is a natural number) stage among the plurality of stages includes:

a pull-up unit configured to output a high voltage of a clock signal as a high voltage of an n-th gate signal in response to a signal of a first node;

a pull-down unit configured to decrease the high voltage of the n-th gate signal to a first low voltage in response to an (n+1)-th carry signal;

a discharging unit configured to discharge a voltage of the first node to a second low voltage lower than the first low voltage in response to a carry signal from at least one stage among stages next to the n-th stage;

a carry unit configured to output the high voltage of the clock signal as an n-th carry signal in response to the signal of the first node;

an inverter unit configured to output a signal in synchronization with the clock signal to a second node in a period other than a period in which the n-th carry signal is output;

a first node storage unit configured to maintain the voltage of the first node at the second low voltage in response to the signal of the second node; and a second node storage unit configured to maintain the voltage of the second node at the first low voltage or the second low voltage in response to the signal of the first node, wherein a control terminal of the second node storage unit is directly connected to the first node, and an input terminal of the second node storage unit is connected to the second node.

2. The gate driver of claim 1, wherein a control terminal of the first node storage unit is connected to the second node, an input terminal of the first node storage unit is connected to the first node, and an output terminal of the first node storage unit is connected to a second voltage terminal configured to receive the second low voltage.

3. The gate driver of claim 2, wherein an output terminal of the second node storage unit is connected to the second voltage terminal.

4. The gate driver of claim 2, wherein an output terminal of the second node storage unit is connected to a first voltage terminal configured to receive the first low voltage.

5. The gate driver of claim 1, wherein the n-th stage further comprises:
a buffer unit including a control terminal and an input terminal connected to a first input terminal configured to receive an (n−1)-th carry signal, and an output terminal connected to the first node.

6. The gate driver of claim 1, wherein the n-th stage further comprises:
a charging unit including a first terminal connected to the first node and a second terminal connected to an output node through which the n-th gate signal is output.

7. The gate driver of claim 1, wherein the n-th stage further comprises:
an output node storage unit configured to maintain a voltage of an output node at the first low voltage in response to the signal of the second node.

8. The gate driver of claim 1, wherein the n-th stage further comprises:
a third node storage unit configured to maintain a voltage of a third node through which the carry signal is output in response to the signal of the second node at the second low voltage.

9. The gate driver of claim 1, wherein the discharging unit includes:
a first discharging unit configured to discharge the voltage of the first node to the second low voltage in response to the (n+1)-th carry signal; and a second discharging unit configured to discharge the voltage of the first node to the second low voltage in response to an (n+2)-th carry signal.

10. The gate driver of claim 1, wherein the discharging unit includes:
a first discharging unit configured to output the voltage of the first node in response to the (n+1)-th carry signal;
a second discharging unit configured to discharge the voltage of the first node to the second low voltage in response to an (n+2)-th carry signal; and
a third discharging unit configured to discharge the voltage of the first node output from the first discharging unit to the second low voltage.

11. A display device, comprising:
a display panel including a display area in which a plurality of gate lines and a plurality of data lines are formed and a peripheral area enclosing the display area;
a gate driver integrated with the display panel in the peripheral area and including a plurality of stages configured to output gate signals to the plurality of gate lines; and
a data driver configured to output data signals to the plurality of data lines,
wherein an n-th (n is a natural number) stage among the plurality of stages includes:
a pull-up unit configured to output a high voltage of a clock signal as a high voltage of an n-th gate signal in response to a signal of a first node;
a pull-down unit configured to decrease the high voltage of the n-th gate signal to a first low voltage in response to an (n+1)-th carry signal;
a discharging unit configured to discharge a voltage of the first node to a second low voltage lower than the first low voltage in response to at least one carry signal from a next stage;
a carry unit configured to output the high voltage of the clock signal as an n-th carry signal in response to the signal of the first node;
an inverter unit configured to output a signal in synchronization with the clock signal to a second node in a period other than a period in which the n-th carry signal is output;
a first node storage unit configured to maintain the voltage of the first node at the second low voltage in response to the signal of the second node; and
a second node storage unit configured to maintain the voltage of the second node at the first low voltage or the second low voltage in response to the signal of the first node, wherein a control terminal of the second node storage unit is directly connected to the first node, and an input terminal of the second node storage unit is connected to the second node.

12. The display device of claim 11, wherein a control terminal of the first node storage unit is connected to the second node, an input terminal of the first node storage unit is connected to the first node, and an output terminal of the first node storage unit is connected to a second voltage terminal configured to receive the second low voltage.

13. The display device of claim 12, wherein an output terminal of the second node storage unit is connected to the second voltage terminal.

14. The display device of claim 12, wherein an output terminal of the second node storage unit is connected to a first voltage terminal configured to receive the first low voltage.

15. The display device of claim 11, wherein the n-th stage further comprises:

a buffer unit including a control terminal and an input terminal connected to a first input terminal configured to receive an (n−1)-th carry signal and an output terminal connected to the first node.

16. The display device of claim 11, wherein the n-th stage further comprises:
a charging unit including a first terminal connected to the first node and a second terminal connected to an output node through which the n-th gate signal is output.

17. The display device of claim 11, wherein the n-th stage further comprises:
an output node storage unit configured to maintain a voltage of an output node at the first low voltage in response to the signal of the second node.

18. The display device of claim 11, wherein the n-th stage further comprises:
a third node storage unit configured to maintain the voltage of a third node through which the carry signal is output in response to the signal of the second node at the second low voltage.

19. The display device of claim 11, wherein the discharging unit includes:
a first discharging unit configured to discharge the voltage of the first node to the second low voltage in response to the (n+1)-th carry signal; and
a second discharging unit configured to discharge the voltage of the first node to the second low voltage in response to an (n+2)-th carry signal.

20. The display device of claim 11, wherein the discharging unit includes:
a first discharging unit configured to output the voltage of the first node in response to the (n+1)-th carry signal;
a second discharging unit configured to discharge the voltage of the first node to the second low voltage in response to an (n+2)-th carry signal; and
a third discharging unit configured to discharge the voltage of the first node output from the first discharging unit to the second low voltage.

21. A gate driver, comprising:
a first unit configured to output a high voltage of a clock signal as a high voltage of a gate signal in response to a signal at a first node;
a second unit configured to decrease the high voltage of the gate signal to a first low voltage in response to a first carry signal;
a third unit configured to discharge a voltage of the first node to a second low voltage lower than the first low voltage in response to a second carry signal;
a fourth unit including a transistor having a control terminal connected to a second node, an input terminal connected to the first node and a output terminal connected to a voltage terminal; and
a fifth unit including a transistor having a control terminal directly connected to the first node, an input terminal connected to the second node and an output terminal connected to the voltage terminal.

22. The gate driver of claim 21, wherein the fifth unit is configured to maintain a voltage of the second node at the second low voltage in response to the signal of the first node while the gate signal is provided to a gate line.

* * * * *